(12) United States Patent
Zollner et al.

(10) Patent No.: US 7,560,354 B2
(45) Date of Patent: Jul. 14, 2009

(54) PROCESS OF FORMING AN ELECTRONIC DEVICE INCLUDING A DOPED SEMICONDUCTOR LAYER

(75) Inventors: Stefan Zollner, Hopewell Junction, NY (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/835,643

(22) Filed: Aug. 8, 2007

(65) Prior Publication Data

US 2009/0042373 A1    Feb. 12, 2009

(51) Int. Cl.
    H01L 21/336    (2006.01)
(52) U.S. Cl. .................... 438/308; 257/E21.471
(58) Field of Classification Search ............... 438/308; 257/E21.471
    See application file for complete search history.

(56) References Cited

U.S. PATENT DOCUMENTS

| | | | |
|---|---|---|---|
| 6,492,216 B1 * | 12/2002 | Yeo et al. .................. 438/197 |
| 6,537,369 B1 * | 3/2003 | Saitoh et al. ................ 117/3 |
| 6,621,131 B2 | 9/2003 | Murthy et al. | |
| 7,029,980 B2 | 4/2006 | Liu et al. | |
| 7,183,576 B2 * | 2/2007 | Chu et al. ................... 257/77 |
| 2002/0011617 A1 * | 1/2002 | Kubo et al. ................ 257/301 |
| 2003/0201461 A1 * | 10/2003 | Sato et al. ................. 257/197 |
| 2008/0224218 A1 * | 9/2008 | Liu et al. .................. 257/351 |

OTHER PUBLICATIONS

Ang, K. et al. "Enhanced Performance in 50 nm N-MOSFETs with Silicon-Carbon Source/Drain Regions," IEEE, pp. 7.8.1-7.8.3, 2004.

Wolf, S. et al. "Silicon Processing for the VLSI Era," Process Technology, vol. 1, pp. 264-267, 1986.

Kahng, D. "Silicon Integrated Circuits," Part B, pp. 36-51, 1981.

Warschkow, O. et al. "Phosphine Adsorption and Dissociation on the Si(001) Surface: An ab initio Survey of Structures," The American Physical Society, pp. 1-15, 2005.

Goh, K. et al. "Effect of Encapsulation Temperature on Si:P -Doped Layers," American Institute of Physics, vol. 85, No. 21, pp. 4953-4955, Nov. 2004.

Goh, K. et al. "Influence of Doping Density on Electronic Transport in Degenerate Si:P -Doped Layers," The American Physical Society, pp. 1-6, 2006.

Kalkofen, B. et al. "A Simple Two-Step Phosphorus Doping Process for Shallow Junctions by Applying a Controlled Adsorption and a Diffusion in an Oxidising Ambient," Materials Science and Engineering, pp. 362-366, 2004.

(Continued)

Primary Examiner—W. David Coleman

(57) ABSTRACT

A process can include forming a doped semiconductor layer over a substrate. The process can also include performing an action that reduces a dopant content along an exposed surface of a workpiece that includes the substrate and the doped semiconductor layer. The action is performed after forming the doped semiconductor layer and before the doped semiconductor layer is exposed to a room ambient. In particular embodiments, the doped semiconductor layer includes a semiconductor material that includes a combination of at least two elements selected from the group consisting of C, Si, and Ge, and the doped semiconductor layer also includes a dopant, such as phosphorus, arsenic, boron, or the like. The action can include forming an encapsulating layer, exposing the doped semiconductor layer to radiation, annealing the doped semiconductor layer, or any combination thereof.

19 Claims, 4 Drawing Sheets

OTHER PUBLICATIONS

Kalkofen, B. et al. "Phosphorus Diffusion into Silicon after Vapor Phase Surface Adsorption of Phosphine," Materials Science and Engineering, pp. 288-292, 2005.

Liow, T. et al. "Carrier Transport Characteristics of Sub-30 nm Strained N-Channel FinFETs Featuring Silicon-Carbon Source/Drain Regions and Methods for Further Performance Enhancement," IEEE, pp. 1-4, 2006.

Ang, K. et al. "Thin Body Silicon-on-Insulator N-MOSFET with Silicon-Carbon Source/Drain Regions for Performance Enhancement," IEEE, pp. 1-4, 2005.

* cited by examiner

PROCESS OF FORMING AN ELECTRONIC DEVICE INCLUDING A DOPED SEMICONDUCTOR LAYER

BACKGROUND

1. Field of the Disclosure

The present disclosure relates to processes, and more particularly to processes of forming electronic devices including doped semiconductor layers.

2. Description of the Related Art

Electronic devices can include phosphorus-doped semiconductor layers. Some of the earliest semiconductor devices include pnp bipolar transistors. After forming a heavily-doped p-type collector region within a monocrystalline silicon substrate, an n-type silicon layer can be epitaxially grown from the substrate. The n-type silicon layer can be in-situ doped using phosphine when the dopant is phosphorus. The dopant concentration of the n-type silicon layer is much lower than the p-type dopant concentration within the collector region. For example, the n-type silicon layer may have 1E15 to 1E17 phosphorus atoms/$cm^3$.

In the 1970s and early 1980s, polycrystalline and amorphous silicon gate processes replaced the older aluminum-gate processes when forming metal-oxide-semiconductor transistors. The polysilicon or amorphous silicon gates were typically n-type doped and could form buried contacts with the substrate. Before high-current ion implanters were used in commercial production, the polysilicon or amorphous silicon gates were formed by depositing an undoped silicon deposition and furnace doping or by depositing an in-situ doped silicon layer. Regarding the former, after depositing an undoped silicon layer (typically at a temperature in a range of 600 to 650° C. for polysilicon or 560° C. for amorphous silicon), the workpiece, including the undoped silicon layer, would be exposed to a phosphorus-containing gas, such as $PH_3/O_2$ or $POCl_3$, at a temperature of 800 to 900° C., and then a dopant drive would be performed at a temperature of 1000 to 1150° C. Alternatively, a heavily doped phosphosilicate glass would be grown or deposited onto the undoped silicon layer, and then a dopant drive would be performed at a temperature of 1000 to 1150° C. The oxide (whether from the $POCl_3$ reaction or the heavily doped phosphosilicate glass) would be stripped from the silicon layer and processing would be continued. Regarding the in-situ doping, the doping would be performed using phosphine at the deposition temperature. For both, the phosphorus concentration would not exceed the solid solubility limit of silicon at the silicon deposition temperature. Regardless of which process was used, the workpieces with the phosphorus-doped silicon layer would be cleaned, and a nitride layer would be deposited before performing a gate electrode etch.

High-current ion implanters have replaced many of the furnace doping operations. Many high-current implants allow doped regions and layers to be formed that typically do not exceed 5E20 phosphorus atoms/$cm^3$. Unlike furnace doping, the highest concentration immediately after ion implantation is not at an uppermost surface of the silicon layer or substrate, but at a projected range, which is spaced apart from that uppermost surface.

BRIEF DESCRIPTION OF THE DRAWINGS

Embodiments are illustrated by way of example and are not limited in the accompanying figures.

Figure 1:
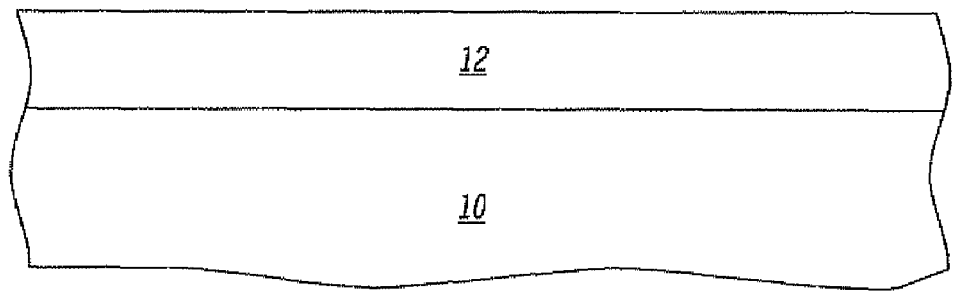
FIG. 1 includes an illustration of a cross-sectional view of a portion of a workpiece that includes a doped semiconductor layer overlying a substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A process can include forming a doped semiconductor layer over a substrate. The process can also include performing an action that reduces a dopant content along an exposed surface of a workpiece that includes the substrate and the doped semiconductor layer. The action is performed after forming the doped semiconductor layer and before the doped semiconductor layer is exposed to a room ambient. In particular embodiments, the doped semiconductor layer includes a semiconductor material that includes a combination of at least two elements selected from the group consisting of C, Si, and Ge, and the doped semiconductor layer also includes a dopant, such as phosphorus, arsenic, boron, or the like. The action can include forming an encapsulating layer, exposing the doped semiconductor layer to radiation, annealing the doped semiconductor layer, or any combination thereof.

Embodiments described herein are useful in reducing odors that may be emitted from doped semiconductor layers. By performing the action after the doped semiconductor layer is formed and before exposing the doped semiconductor layer to a room ambient, the dopant content along an exposed surface of a workpiece can be significantly reduced. The action reduces the likelihood that humans would detect a foul odor from the doped semiconductor layer. Thus, the environmental and safety concerns can be significantly reduced. While much of the disclosure focuses on phosphorus, the concepts described herein may be applicable to other dopants that would be present in doped semiconductor layers.

The inventors believe that the problems described herein may not have occurred in conventional processing sequences for various reasons. If the doped semiconductor layer would be used as part of an active base region, the dopant concentration would be no higher than 1E18 atoms/$cm^3$, and thus, no significant phosphorus odor would have been detected by humans. If the doped semiconductor layer would be doped using POCl$_3$ or a phosphosilicate glass, the temperature used for the dopant drive (1000 to 1100° C.) would likely reduce the phosphorus concentration at the surface, and thus, no significant phosphorus odor would be detected by humans. If the doped semiconductor layer would be doped by ion implantation, the dopant profile is characterized by a generally Gaussian distribution having a highest dopant concentration at the projected range, which is at a distance spaced apart from the exposed surface. Thus, at the exposed surface, the dopant concentration is low enough that phosphorus odors would not be detected by humans. Therefore, the inventors believe that odors have not typically been generated by doped semiconductor layers used to form electronic devices in a production environment due to various reasons, as previously described.

Before addressing details of embodiments described below, some terms are defined or clarified. The term "elevation" is intended to mean a shortest distance to a reference plane. In one embodiment, the reference plane is a primary surface of a substrate before forming any features overlying the substrate.

Unless otherwise defined, all technical and scientific terms used herein have the same meaning as commonly understood by one of ordinary skill in the art to which this invention belongs. Other features and advantages of the invention will be apparent from the following detailed description, and from the claims. To the extent not described herein, many details regarding specific materials, processing acts, and circuits are conventional and may be found in textbooks and other sources within the semiconductor and microelectronic arts.

FIG. 1 includes a cross-sectional view of a portion of a workpiece that includes a doped semiconductor layer 12 overlying a substrate 10. The substrate 10 can include a monocrystalline semiconductor wafer, a semiconductor-on-insulator wafer, a flat panel display (e.g., a silicon layer over a glass plate), a silicon layer on a flexible sheet of organic material, or other substrate conventionally used to form electronic devices. The substrate 10 includes silicon, carbon, germanium, or any combination thereof. A portion of the substrate 10 adjacent to the semiconductor layer 12 can be undoped, p-type doped, or n-type doped. If doped, the portion of the substrate 10 adjacent to the doped semiconductor layer 12 has a dopant concentration no greater than approximately 1E19 atoms per cubic centimeter, and in a particular embodiment is less than 1E17 atoms per cubic centimeter.

The doped semiconductor layer 12 can include silicon, carbon, germanium, or any combination thereof. The semiconductor compositions of the substrate 10 and the doped semiconductor layer 12 can include the same semiconductor material or different semiconductor materials. For example, the substrate 10 can include a substantially monocrystalline silicon material adjacent to the doped semiconductor layer 12, and the doped semiconductor layer 12 can include a carbon-doped silicon material or a germanium-doped silicon material. In another embodiment, the substrate 10 can include a germanium-doped silicon material, and the doped semiconductor layer 12 can include substantially monocrystalline silicon. Other combinations are possible.

The doped semiconductor layer 12 can include phosphorus at a concentration of at least approximately 1E20 atoms per cubic centimeter. In a particular embodiment, the doped semiconductor layer 12 has a concentration of at least 1E21 atoms per cubic centimeter and can be used as part of a source/drain region of a field-effect transistor, an emitter region of a bipolar transistor, another suitable heavily doped region within an electronic device, or any combination thereof. In a more particular embodiment, the dopant concentration is at least approximately 3E21 atoms per cubic centimeter.

In the embodiment illustrated in FIG. 1, the doped semiconductor layer 12 is epitaxially grown from the substrate 10 or deposited over the substrate 10. In one embodiment the doped semiconductor layer 12 is in-situ doped with phosphorus. As initially formed, the dopant concentration throughout the thickness of the doped semiconductor layer 12 is substantially uniform. A semiconductor-containing gas and a phosphorus-containing gas can be reacted within a chamber when forming the doped semiconductor layer 12. The reaction can include decomposition of a reactant, reaction between reactants, or a combination of deposition and reaction. If the doped semiconductor layer 12 includes silicon, a silicon-containing gas is $Si_aH_{(2a+2)}$, wherein a is 1, 2, or 3. If the doped semiconductor layer 12 includes carbon, a silicon-carbon-containing gas can include $Si_bC_cH_{(2(b+c)+2)}$, wherein the sum of b+c is 1, 2, or 3, and c is greater than 0. If the doped semiconductor layer 12 includes germanium, a germanium-containing gas is $GeH_4$. One more halogen atoms (e.g., F, Cl, Br, etc.) may be substituted for one or more hydrogen atoms in any of the silicon-containing gas, carbon-containing gas, or germanium-containing gas. The phosphorus-containing gas includes $PH_3X_{3-d}$, wherein X is a halogen, and d is 0, 1, 2, or 3. For example, the phosphorus-containing gas includes $PH_3$, $PF_3$, $PF_5$, $PCl_3$, $PCl_5$, $PBr_3$, $PBr_5$, a mixed phosphorus halide (a molecule with of P and different halogens), a phosphorus halide-hydride (a molecule with of P, H, and halogen atoms), or any combination thereof. If the material for the phosphorus-containing gas is a liquid or solid at room temperature and pressure, a conventional heating system can be used to generate a gas from the liquid or solid. The ratio of the semiconductor-containing gases to the phosphorus-containing gases can be adjusted to give the desired concentration of phosphorus within the doped semiconductor layer 12.

The temperature used to form the doped semiconductor layer 12 can depend on the gases chosen. The temperature needs to be high enough to cause the gases to react (e.g., decompose, react with each other, or any combination thereof) and deposit over the substrate 10. The temperature used for the deposition increases as the number of semiconductor atoms within the molecule decrease and as the number of halogen substituents (for otherwise H atoms) within the molecule increases. Thus the temperature may be as low as approximately 200° C. to as high as approximately 1200° C. The temperature of the deposition may also be affected by when in the process the doped semiconductor layer 12 is formed. If the doped semiconductor layer 12 is formed relatively later in the process (e.g., after forming a gate structure or an active base region), a lower temperature may be chosen to reduce adverse affects to other portions of the workpiece for reasons not directly related to the doped semiconductor layer 12 (e.g., undesired diffusion of a dopant within a previously-formed doped region within a workpiece). In one embodiment, the temperature may be no higher than approximately 550° C., and in a particular embodiment, is in a range of approximately 450° C. to approximately 520° C.

All other parameters (e.g., chamber pressure, actual flow rates of the gases, etc.) used in the formation of the doped semiconductor layer 12 are conventional or proprietary. If the doped semiconductor layer 12 is deposited over and not epitaxially grown from the substrate 10, the deposition may or may not be plasma assisted. When the doped semiconductor layer 12 is formed, all of the semiconductor-containing and phosphorus-containing gases are terminated at substantially the same time. In other embodiments, a substantially undoped semiconductor layer can be formed and subsequently furnace doped or ion implanted.

In the embodiment as illustrated in FIG. 1, the doped semiconductor layer 12 is formed, such that the phosphorus concentration within the doped semiconductor layer 12 may be near, at, or above the solid solubility limit of phosphorus within the semiconductor material within the doped semiconductor layer 12. At a high phosphorus concentration, the doped semiconductor layer 12, as formed, may have a significant amount of phosphorus along the exposed surface and emit an undesired odor. The undesired odor could result in an emergency evacuation of personnel from a manufacturing facility. The emergency evacuation results in lost production and potentially scrapped workpieces.

To reduce the phosphorus odor from the doped semiconductor layer 12, an action is performed after the doped semiconductor layer 12 is formed and before exposing the workpiece, including the doped semiconductor layer 12 and the substrate 10, to a room ambient. By performing the action, the phosphorus content at an exposed surface of the semiconductor layer can be reduced such that it cannot be detected by humans. Thus, the likelihood of an emergency evacuation due to the phosphorus odor is substantially eliminated. If desired, a growth interruption can occur between forming the doped semiconductor layer 12 and performing the action. For example, the doped semiconductor layer 12 can be formed by epitaxially growing the doped semiconductor layer 12, and the growth interruption can include disrupting the crystal pattern at the exposed surface of the doped semiconductor layer 12 before performing the action.

The action can include forming an encapsulating layer (FIG. 2), exposing the surface to a plasma or energy (FIG. 3), annealing the workpiece (FIG. 4), or any combination thereof. The action may be performed in the same chamber or a different chamber as forming the semiconductor material for the doped semiconductor layer 12. When different chambers are used, the different chambers may be part of the same processing tool or different processing tools. When different processing tools are used, the workpieces may be placed into a sealed container before transporting the workpieces from one processing tool to the other processing tool. Regardless of equipment configurations and processing floor layout, the workpieces with the doped semiconductor layer 12 as formed are not directly exposed to the room ambient where humans are present.

Figure 2:
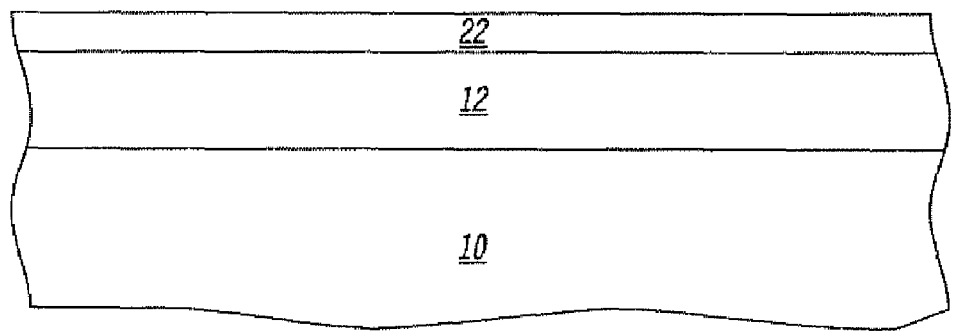
FIG. 2 includes an illustration of a cross-sectional view of the workpiece of FIG. 1 after forming an encapsulating layer over the doped semiconductor layer.

In one embodiment, the action includes forming an encapsulating layer 22 over the doped semiconductor layer 12, as illustrated in FIG. 2. The encapsulating layer 22 is a semiconductor layer, an oxide layer, a nitride layer, an oxynitride layer, or any combination of those layers. The thickness of the encapsulating layer 22 is sufficiently thick to significantly reduce the phosphorus odor and substantially eliminate the likelihood of an emergency evacuation. In one embodiment, the thickness of the encapsulating layer 22 is at least approximately 1.1 nm, and in another embodiment is at least approximately 20 nm, and in still another embodiment is at least approximately 50 nm. Although no theoretical maximum thickness is known, typically another concern unrelated to phosphorus odors (e.g., equipment throughput, etch complexity, film strain, etc.) could effectively limit the thickness of the encapsulating layer 22. In one embodiment, the thickness of the encapsulating layer 22 is no greater than approximately 900 nm, and in another embodiment is no greater than approximately 500 nm, and in still another embodiment is no greater than 90 nm. After reading the specification, skilled artisans will be able to determine the actual composition and thickness of the encapsulating layer 22 or meet their particular applications. The encapsulating layer 22 can be formed using a conventional or proprietary process.

Figure 3:
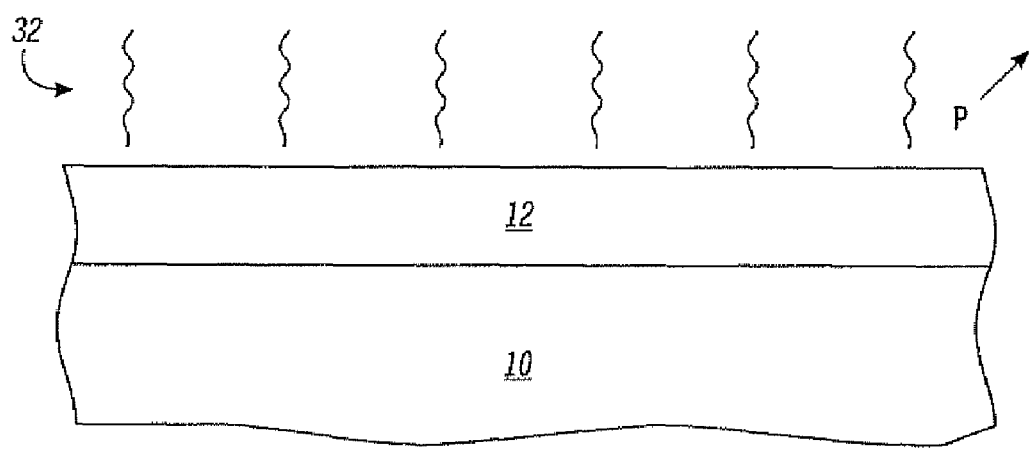
FIG. 3 includes an illustration of a cross-sectional view of the workpiece of FIG. 1 during exposure to energy.

In another embodiment, the action includes exposing the surface of the doped semiconductor layer 12 to a plasma, radiation, an energy beam, or any combination thereof, as illustrated by serpentine lines 32 in FIG. 3.

In one embodiment, a plasma is used. The plasma can be an ionized gas directly exposed to the surface of the doped semiconductor layer or a downstream plasma including neutral (i.e., uncharged) species. A species in the plasma can include noble atoms (He, Ne, Ar, Xe, Rn), hydrogen atoms, oxygen atoms, nitrogen atoms, halogen atoms (F, Cl, Br, etc.), or any combination thereof. The doped semiconductor layer 12 may be directly exposed to ions in the plasma or may be exposed to an effluent from a plasma generator (i.e., a downstream plasma). Plasma processing can be performed at a significantly lower temperature than exposure to electromagnetic radiation or an energy beam. If charge build-up with a plasma is a concern, an electron flood may be used to neutralize the charge on the workpiece before it is removed from the chamber.

If a downstream plasma is used, reactive neutral species may exit the plasma generator and, by themselves or in conjunction with another species, can remove phosphorus from the surface of the doped semiconductor layer 12. In a particular embodiment, hydrogen gas is introduced into a plasma generator and produces an effluent including neutral hydrogen atoms. $NF_3$ can be combined with the neutral hydrogen atoms to produce a N—H—F compound that can be used to remove phosphorus near the surface of the doped semiconductor layer. In another particular embodiment, a hydrogen halide (e.g., HCl, HBr, etc.) can be used with a downstream plasma to produce neutral hydrogen and halogen atoms. The halogen atoms can replace phosphorus atoms in the Si—P bonds to form Si—X bonds (where X is a halogen), which can passivate the exposed surface. The hydrogen atoms can react with the free (i.e., not chemically bonded) phosphorus or from a Si—P bond, to form $PH_3$, which can be removed as a gas. After reading this specification, skilled artisans will appreciate that many other embodiments are possible.

The actual conditions used for the plasma processing can depend on what structures or layers are exposed at the time of the plasma processing. For example, if an oxide or nitride material is present and is not to be removed, the chemistry and other plasma parameters can be adjusted to allow sufficient selectivity so that the phosphorus concentration is reduced without significantly adversely affecting the oxide or nitride material. Skilled artisans appreciate that some erosion of the oxide or nitride material may be tolerated, and after reading this specification can select the actual conditions depending on the particular application.

In another embodiment, the doped semiconductor layer 14 can be exposed to energy that includes electromagnetic radiation. The energy source for the electromagnetic radiation can be lamp-based or laser-based, monochromatic or broadband. In one embodiment, the electromagnetic radiation is sufficient energy to break Si—P bonds, P—P bonds, or a combination thereof. In one embodiment, the emission maximum is at a wavelength greater than approximately 700 nm. In another embodiment, heat may be a concern, and therefore, the wavelength can be less than approximately 400 nm. The emission maximum may be at least approximately 200 nm to reduce the likelihood that the radiation would pass through quartz walls if a quartz liner was used within the chamber. The electromagnetic radiation is exposed at a dose and total exposure time to significantly reduce the phosphorus odor from the doped semiconductor layer 12.

In one embodiment, a flood exposure of the doped semiconductor layer 12 can be used, and in another embodiment, a selective exposure using a radiation beam (e.g., from a laser) can be used. The electromagnetic radiation can be continuous during the exposure or can be pulsed. Pulsing the energy source is useful if the dose and total exposure time of the electromagnetic radiation would heat the locally exposed portion of the doped semiconductor layer 12 above the temperature used to form the semiconductor material within the doped semiconductor layer 12. For example, if the doped semiconductor layer 12 is formed at a temperature of approximately 500° C., the local temperature of the doped semiconductor layer 12 (portion exposed to the electromagnetic radiation) should not be higher than approximately 500° C. Pulsing allows the workpiece to cool between pulses to better control the local temperature.

In another embodiment, the energy can come from an energy source that emits an energy beam of electrons or ions. The doped semiconductor layer 12 is exposed to the energy beam at a dose and total exposure time to significantly reduce the phosphorus odor from the doped semiconductor layer 12. The energy beam can be continuous on during the exposure or can be pulsed. Pulsing the energy source is useful if the dose and total exposure time of the electron beam would heat the locally exposed portion of the doped semiconductor layer 12 above the temperature used to form the semiconductor material within the doped semiconductor layer 12. Pulsing allows the workpiece to cool between pulses to better control the local temperature.

Figure 4:
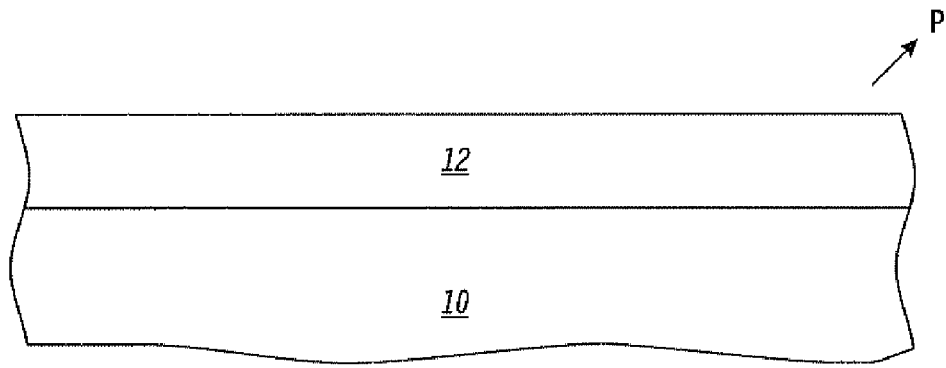
FIG. 4 includes an illustration of a cross-sectional view of the workpiece of FIG. 3 during an anneal.

In still another embodiment, the workpiece including the doped semiconductor layer 12 can be annealed, as illustrated in FIG. 4. The annealing conditions may be highly varied and can depend on the particular application. The anneal can be performed at the same temperature as the temperature used to form the semiconductor material within the doped semiconductor layer 12 or at a higher temperature. In one embodiment, the anneal is performed at a temperature of at least approximately 650° C., which allows the phosphorus to be desorbed from the exposed surface of the doped semiconductor layer 12. In a particular embodiment, the ambient is performed under vacuum, or using a substantially inert gas (e.g., Ne, He, Ar, Xe, Rn). If a vacuum is used, the pressure for the anneal is less than the pressure when forming the semiconductor material within the doped semiconductor layer 12. On a relative basis, a stronger vacuum (lower pressure) is more effective at removing the phosphorus compared to a weaker vacuum (higher pressure). The anneal may be performed using a reactive species. The gas for the anneal can include $H_2$, $O_2$, a halogen-containing gas (e.g., HX, $X_2$, etc., wherein X is a halogen atom), or any combination thereof. The reactive species can react with the phosphorus to form a gas that is removed or form a layer from the doped semiconductor layer, wherein such layer formed during the anneal is subsequently removed.

In an alternative embodiment, a combination of the actions may be performed. In one embodiment, neutral hydrogen atoms can be obtained from a downstream plasma and fed into an annealing chamber where the workpiece, including the doped semiconductor layer 12, is located. In another embodiment, the anneal can be performed with a reactive species that forms an encapsulating layer similar to encapsulating layer 22, as illustrated in FIG. 2. After reading this specification, skilled artisans will be able to select an action after forming the doped semiconductor layer 12 to reduce the phosphorus odor emitted from workpieces that include the doped semiconductor layer 12 in view of the particular application.

After the action has been performed, the amount of phosphorus odor from the doped semiconductor layer 12 is sufficiently low that phosphorus would not be detected by humans. At this time, the workpiece including the doped semiconductor layer 12 can be exposed to the room ambient. If desired, a wet clean after the action helps to reduce further the phosphorus content at the surface of the doped semiconductor layer 12.

The concepts described herein will be further described in the following Example, which does not limit the scope of the claims. The Example demonstrates that an action is performed after forming a doped semiconductor layer and can reduce the phosphorus odor from the doped semiconductor layer before the doped semiconductor layer is exposed to a human within the room ambient. More particularly, FIGS. 5 to 10 include illustrations for a particular application in which a doped semiconductor layer is being formed relatively late during transistor formation when forming an electronic device.

Figure 5:
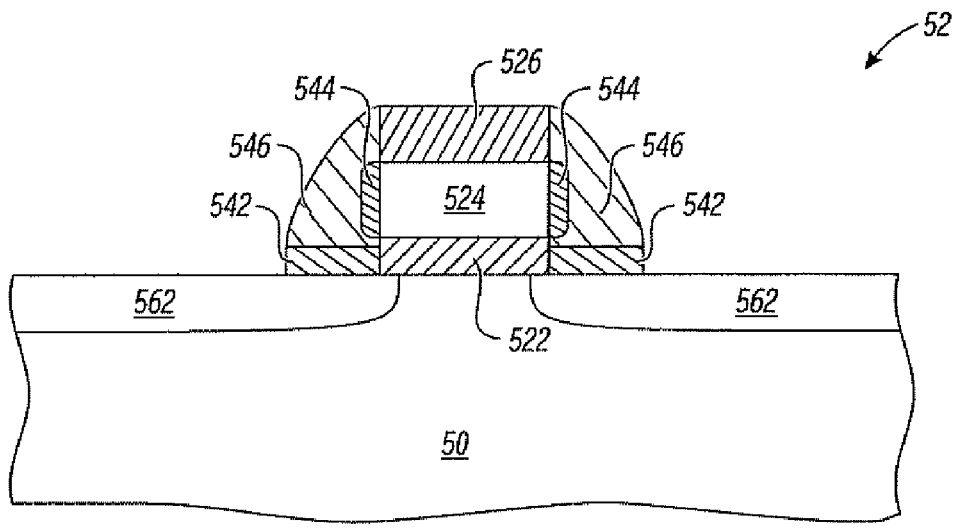
FIG. 5 includes an illustration of a cross-sectional view of a workpiece including a substrate, a gate structure, a spacer, and extension regions.

FIG. 5 includes an illustration of a cross-sectional view of a partially completed electronic device which includes a substrate 50 and a gate structure 52 over the substrate 50. The gate structure includes a gate dielectric layer 522 overlying the substrate 50, a gate electrode 524 overlying the gate dielectric layer 522, and a capping layer 526 overlying the gate electrode 524. The gate dielectric layer 522 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. The gate dielectric layer 522 has a thickness in a range of approximately 3 to approximately 10 nm. The thickness and material selection of the gate dielectric layer 522 will substantially determine its electrical properties. In one embodiment, the thickness and material are chosen such that the gate dielectric layer 522 has a silicon dioxide equivalent thickness of approximately 10 nm. The gate dielectric layer 522 can be thermally grown using an oxidizing or nitridizing ambient, or deposited using a conventional or proprietary chemical vapor deposition technique, physical vapor deposition technique, atomic layer deposition technique, or a combination thereof.

The gate electrode 524 is formed from a gate electrode layer which may include a semiconductor-containing film, a metal-containing film, or any combination thereof. In one embodiment, the gate electrode layer includes polysilicon or amorphous silicon. In another embodiment, the gate electrode layer may include one or more other materials. In a particular embodiment, the thickness of gate electrode layer is not greater than approximately 200 nm, and in another particular embodiment is no greater than 90 nm. In yet another embodiment, the thickness of gate electrode layer is at least approximately 20 nm, and in another particular embodiment is at least 50 nm. In a finished device, the gate electrode layer can have a dopant concentration of at least 1E19 atoms/$cm^3$ when gate electrode layer includes polysilicon or amorphous silicon. The gate electrode layer can be deposited by chemical vapor deposition, physical vapor deposition, or a combination thereof using a conventional or proprietary technique.

A capping layer 526 overlies the gate electrode layer. The capping layer 526 can protect the gate electrode layer during subsequent processing, be an anti-reflective coating, perform another suitable function, or any combination thereof. The capping layer 526 can include an oxide, a nitride, an oxynitride, or any combination thereof. The capping layer 526 has a thickness as described with respect to the thicknesses for the gate electrode layer. The capping layer 526 can have the same or different thickness as the gate electrode layer. The capping layer 526 can be thermally grown or deposited using a conventional or proprietary technique.

The capping layer 526 and the gate electrode layer are patterned to form the gate structure 52 that includes the gate electrode 524. The gate dielectric layer 522 can be patterned when patterning the capping layer 526 and the gate electrode layer, or portions (not illustrated) of the gate dielectric layer 522 (not covered by the gate electrode 524) can be removed at a later time. The patterning to define the sides of the gate structure 52 is performed using a conventional or proprietary lithographic and etch operation.

Exposed portions of the gate substrate 50 and gate electrode 524 are thermally oxidized to form oxide layers 542 and 544. Alternatively, a thin layer oxide (not illustrated) can be deposited over exposed portions of the workpiece, including the substrate 50 and gate structure 52. Extension regions 562 are formed within the substrate 50. The extension regions 562 are p-type doped or n-type doped, depending on the type of transistor being formed. For an n-channel transistor, the extension regions 562 are n-type doped. The doping concentration can be in a range of approximately 1E15 to approximately 1E18 atoms/cm$^3$. The extension regions 562 are formed using a conventional or proprietary ion implantation process. A spacer 546 is formed adjacent to the sides of the gate structure 52. The spacer 546 can be formed by depositing a nitride layer and anisotropically etching the nitride layer using a conventional or proprietary process.

Figure 6:
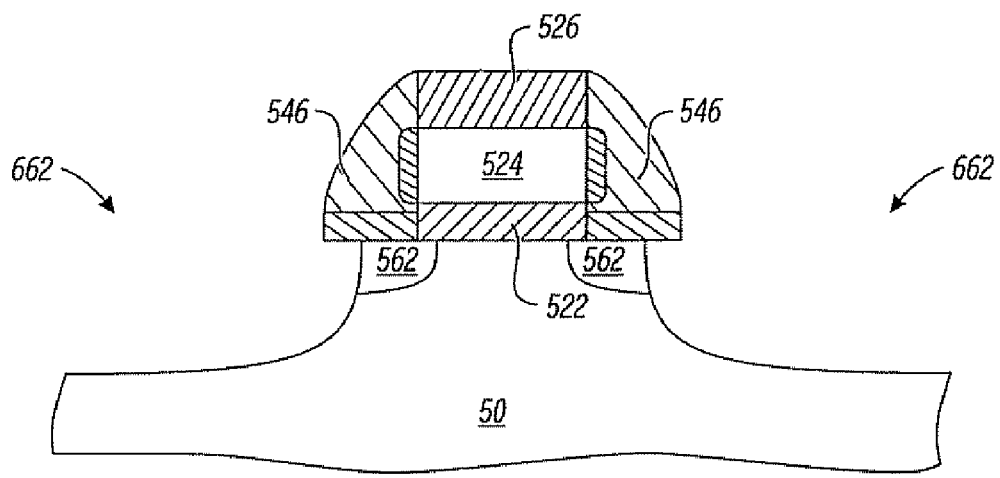
FIG. 6 includes an illustration of a cross-sectional view of the workpiece of FIG. 5 after etching portions of the substrate.

Portions of the substrate 50 not covered by the gate structure 52 or the spacer 546 are etched to form trenches 662, as illustrated in FIG. 6. An isotropic etch, an anisotropic etch, or a combination thereof can be used in forming the trench. The etch chemistry used depends on the material of the substrate 50 and whether a particular portion of the etch is isotropic or anisotropic. When the substrate 50 includes silicon, germanium, or both, the etch chemistry includes a fluorine-containing gas, a chlorine-containing gas, a bromine-containing gas, or any combination thereof. If the substrate 50 includes carbon, a relatively small amount of an oxygen-containing gas may be used. If the etch is anisotropic, the etch chemistry can include a hydrogen-containing gas, or the fluorine-containing, chlorine-containing, or bromine-containing gas can include one or more hydrogen atoms. If the etch is isotropic, the etch chemistry can have a relatively small fraction of hydrogen or no hydrogen. As illustrated in FIG. 6, part of the etch or substantially all of the etch is performed isotropically. Portions of the spacer 546 are undercut by the etch when forming the trenches 662. The trenches 662 can correspond to the bottom surfaces of the subsequently formed source/drain regions. In a particular embodiment, the depth of the trenches 662 can be substantially the same as the subsequently formed source/drain regions. The isotropic etch can also reduce the likelihood of forming sharp corners in the substrate 50, which could subsequently result in areas of high electrical field. All other etching parameters are conventional or proprietary.

Figure 7:
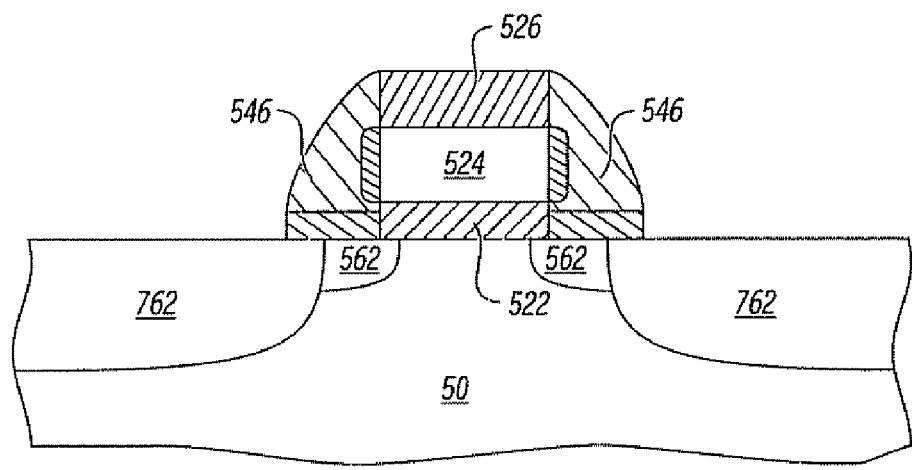
FIG. 7 includes an illustration of a cross-sectional view of the workpiece of FIG. 6 after forming a doped semiconductor layer.

FIG. 7 includes an illustration of a cross-sectional view of the workpiece after forming a doped semiconductor layer 762. In a particular embodiment, the transistor structure illustrated in FIG. 7 can be used as an n-channel transistor within an electronic device having a complementary metal-oxide semiconductor ("CMOS") technology. Although not illustrated in FIG. 7, other transistor structures for n-channel transistors and p-channel transistors can also be formed. The n-channel transistors have a higher electron mobility when the channel region of the n-channel transistor is under tensile strain, and the p-channel transistors have a higher hole mobility when the channel region of the p-channel transistor is under compressive strain. In this particular embodiment, the doped semiconductor layer 762 includes a carbon-doped silicon layer. The doped semiconductor layer 762 also includes an n-type dopant, such as phosphorus, arsenic, antimony, or any combination thereof. The n-dopant concentration within the doped semiconductor layer 762 is at least 1E19 atoms/cm$^3$ to allow ohmic contact to subsequently-formed conductive plugs or other conductive structures. In further particular embodiments, the n-type dopant concentration is at least approximately 1E20 atoms/cm$^3$, 1E21 atoms/cm$^3$, 3E21 atoms/cm$^3$, or the like. The n-type dopant concentration may exceed the solid solubility of the dopant at the temperature used to form the semiconductor material for the doped semiconductor layer 762.

The doped semiconductor layer 762 can be formed by epitaxially growing or depositing a semiconductor material previously described with respect to the doped semiconductor layer 12. The doped semiconductor layer 762 can be selectively formed such that it is formed only within the trenches 662, and not overlying the capping layer 526 and the spacer 546. If the doped semiconductor layer 762 is not to be formed within areas including p-channel transistors, existing insulating layers or an additional insulating layer can be formed over those areas.

The temperature at which the doped semiconductor layer 762 is formed can be limited by processing considerations not directly related to the formation of the doped semiconductor layer 762. For example, the extension regions 562 are not to be significantly diffused any further. Thus, the doped semiconductor layer 762 may be formed at a temperature no greater than 650° C. In a more particular embodiment, the doped semiconductor layer 762 is formed at a temperature no greater than approximately 550° C., at a temperature in a range of approximately 450° C. to approximately 520° C., or at another temperature. The semiconductor-containing gases can include any of the gases previously described with respect to the doped semiconductor layer 12. In one particular environment, the semiconductor gases can include $SiH_4$ and $SiH_3CH_3$.

The doped semiconductor layer 762 can be in-situ doped or subsequently doped with an n-type dopant. If in-situ doped, a phosphorus-containing gas can be included with the semiconductor-containing gases. In a particular embodiment, the phosphorus containing gases can include $PH_3$. When the doped semiconductor layer 762 is in-situ doped, the resulting dopant concentration within the doped semiconductor layer 762 can be substantially uniform. If the doped semiconductor layer 762 is subsequently doped, an appropriate dopant can be introduced within a furnace or ion implanted using an appropriate species. An activation cycle can be used to activate the dopant.

When the phosphorus content within the doped semiconductor layer 762 is very high (at least approximately 1E20 atoms/cm$^3$), the doped semiconductor layer 762 could emit a phosphorus odor that would be detected by humans if the workpiece would be exposed to a room ambient. Thus, an action is performed to reduce or substantially eliminate the likelihood that the workpiece would emit a phosphorus odor that would be detected by humans. The action performed can be any of the actions previously described to reduce phosphorus odor from the doped semiconductor layer 12. For example, the action can include forming an encapsulating layer, exposing the doped semiconductor layer 762 to radiation, annealing the doped semiconductor layer 762, or any combination thereof. The action will be performed before the workpiece is exposed to a room ambient.

Figure 8:
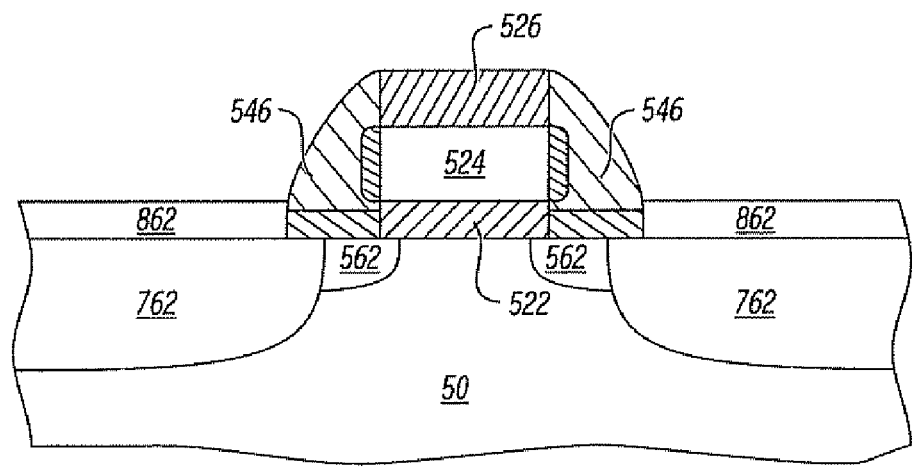
FIG. 8 includes an illustration of a cross-sectional view of the workpiece of FIG. 7 after forming an encapsulating layer.

In an embodiment illustrated in FIG. 8, an encapsulating layer 862 is formed over the doped semiconductor layers 762. The encapsulating layer 862 can include a semiconductor material, an oxide, a nitride, an oxynitride, or any combination thereof. The thickness of the encapsulating layer 862 is no greater than approximately 20 nm, and in particular embodiments, is no greater than approximately 9 nm, or approximately 5 nm. The encapsulating layer 862 is formed using a conventional or proprietary thermal growth or deposition technique. If desired, an additional layer can be formed over the encapsulating layer 862, or the encapsulating layer 862 can be exposed to radiation or annealed. At this point in the process, the workpiece can now be exposed to a room ambient without a significant risk of a phosphorus odor being detected by a human.

Figure 9:
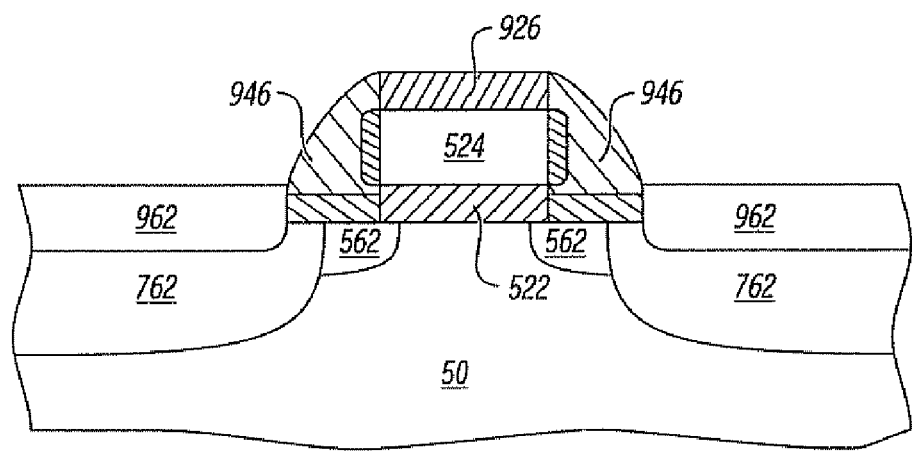
FIG. 9 includes an illustration of a cross-sectional view of the workpiece of FIG. 8 after forming silicide regions.

The workpiece is further processed to form silicide regions 926 and 962, as illustrated in FIG. 9. The silicide regions 926 and 962 include a metal-containing material, such as titanium silicide, tungsten silicide, tantalum silicide, cobalt silicide, nickel silicide, erbium silicide, platinum silicide, other suitable silicide compound, or any combination thereof. The capping layer 526 and the encapsulating layer 862 can be removed to expose portions of the gate electrode 524 and the doped semiconductor layer 762. Part of the spacer 526 can be etched when removing the capping layer 526, thereby resulting is spacer 946. In another embodiment, if the encapsulating layer 862 includes a semiconductor material, such as silicon or carbon-doped silicon, the encapsulating layer 862 may remain over the doped semiconductor layer 762. A conventional or proprietary self-aligned silicide process can be performed to form the silicide region 926 from a portion of the gate electrode 524, and the silicide regions 962 from portions of the doped semiconductor layer 762. If the encapsulating layer 862 includes a semiconductor material, part or all of the encapsulating layer 862 is consumed when forming the silicide regions 962.

Figure 10:
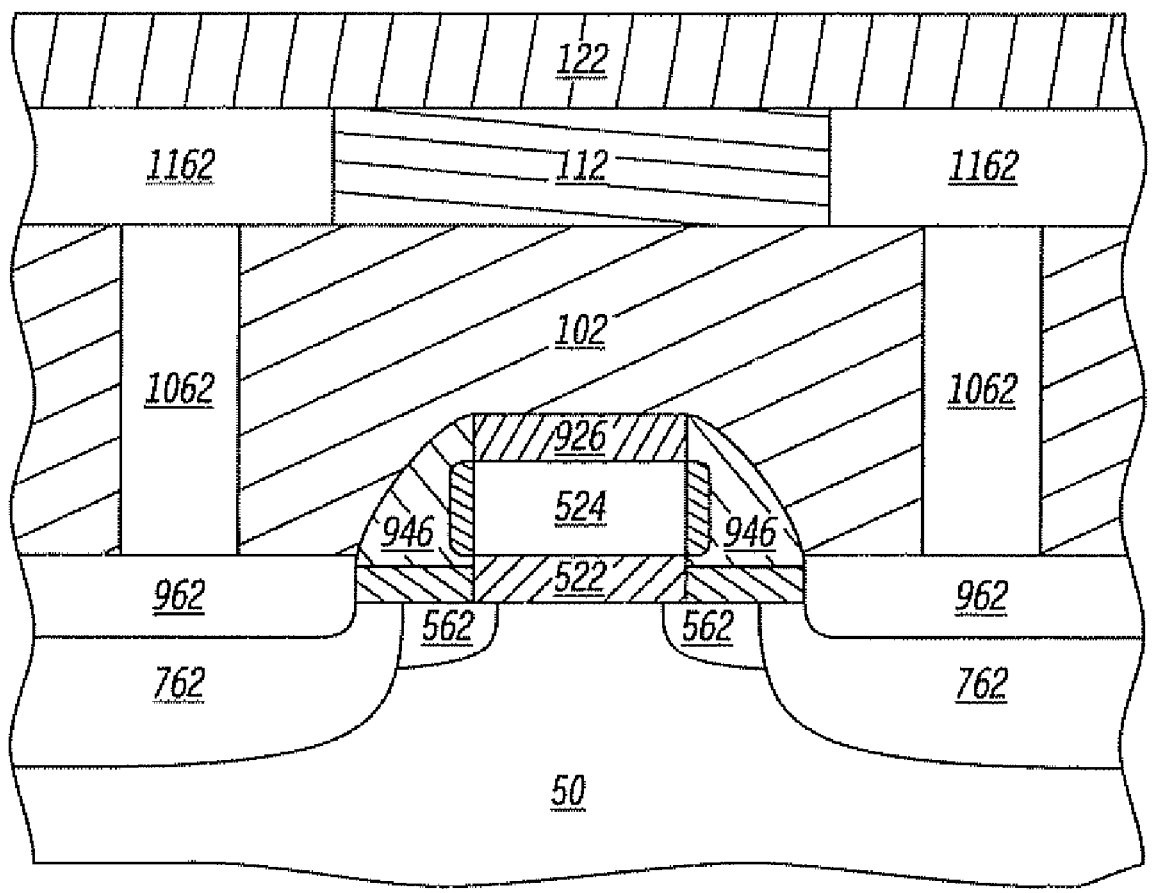
FIG. 10 includes an illustration of a cross-sectional view of the workpiece of FIG. 9 after forming a substantially completed electronic device.

FIG. 10 includes an illustration of a cross-sectional view of a substantially completed electronic device. As illustrated in FIG. 10, an interlevel dielectric layer 102 is formed over the workpiece by a conventional or proprietary technique. The interlevel dielectric layer 102 is patterned to form contact openings that extend to the silicide regions 962. Although not illustrated in FIG. 10, other contact openings are made to the silicide region 926 and other part of the electronic device, such as to the p-channel transistors and other electronic components. The interlevel dielectric layer 102 can include an insulating material, such as an oxide, a nitride, an oxynitride, or a combination thereof. In a specific embodiment, an anisotropic etch can be used to form contact openings.

Conductive plugs 1062 and conductive lines 1162 are then formed. Other conductive plugs and conductive lines are formed but are not illustrated in FIG. 10. The conductive plugs 1062 and the conductive lines 1162 can include the same or different conducting materials. Each of the conductive plugs 1062 and the conductive lines 1162 can include doped silicon, tungsten, titanium, tantalum, titanium nitride, tantalum nitride, aluminum, copper, another suitable conductive material, or any combination thereof. In one particular embodiment, the conductive plugs 1062 include tungsten, and the conductive lines 1162 include copper. An optional barrier layer, adhesion layer, or any combination thereof may be formed before the corresponding conductive layers (e.g., tungsten for the conductive plugs 1062 and copper for the conductive lines 1162). An optional capping layer (e.g., a metal-containing nitride) may be used to encapsulate copper within the conductive lines 1162.

In one embodiment, the conductive plugs 1062 are formed before the conductive lines 1162. In one particular embodiment, a conductive layer (not illustrated) is formed over interlevel dielectric layer 102 and substantially fills contact openings therein. Portions of the conductive layer that lie outside the contact openings are removed to form the conductive plugs 1062. A conventional or proprietary chemical-mechanical polishing operation or a conventional or proprietary etching process can be performed.

An insulating layer 112 is then deposited and patterned to form interconnect trenches where the conductive lines 1162 are formed. The insulating layer 112 can include any of the materials previously described with respect to the interlevel dielectric layer 102. The insulating layer 112 can have the same or different composition as compared to the interlevel dielectric layer. Other interconnect trenches can be formed at locations but are not illustrated. In one embodiment, another conductive layer is formed over the interlevel dielectric layer 102 and substantially fills the interconnect trenches in the insulating layer 112. Portions of the conductive layer that lie outside the interconnect trenches within the insulating layer are removed to form the conductive lines 1162. In one embodiment, a conventional or proprietary chemical-mechanical polishing operation can be performed, and in another embodiment, a conventional or proprietary etching process can be performed. The insulating layer 112 lies at substantially the same elevation as and between the conductive lines 1162 and other conductive lines that are not illustrated. In another embodiment (not illustrated), the conductive plugs 1062 and the conductive lines 1162 are formed concurrently using a conventional or proprietary dual-inlaid process.

In another embodiment (not illustrated), additional insulating and conductive layers can be formed and patterned to form one or more additional levels of interconnects. After the last interconnect level has been formed, an encapsulating layer 122 is formed. The encapsulating layer 122 can include one or more insulating film, such as an oxide, a nitride, an oxynitride, or a combination thereof.

Embodiments described herein are useful in reducing odors that may be emitted from doped semiconductor layers. An action is performed before the doped semiconductor layer is exposed to humans to reduce the likelihood that humans would detect a foul odor from the doped semiconductor layer. Thus, the environmental and safety concerns can be significantly reduced. While much of the disclosure has focused on phosphorus, the concepts described herein may be applicable to other dopants that would be present in doped semiconductor layers.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include forming a doped semiconductor layer over a substrate, wherein the doped semiconductor layer includes a dopant and at least two other different elements selected from a group consisting of C, Si, and Ge. The process can also include performing an action to reduce a dopant content at an exposed surface of a workpiece that includes the substrate and the doped semiconductor layer, wherein performing the action is performed after forming the doped semiconductor layer and before the doped semiconductor layer is exposed to a room ambient.

In one embodiment of the first aspect, forming a doped semiconductor layer includes forming a doped semiconductor layer including carbon. In a particular embodiment, forming a doped semiconductor layer includes forming an in-situ phosphorus doped semiconductor layer. In another particular embodiment, the process further includes etching a semiconductor material within a substrate to form a trench within the substrate, wherein forming the doped semiconductor layer includes forming the doped semiconductor layer within the trench. In a more particular embodiment, the process further includes forming a gate structure over the substrate before etching the semiconductor material.

In an even more particular embodiment, forming the doped semiconductor layer includes forming an in-situ phosphorus doped semiconductor layer at a first temperature, and performing the action is performed at a second temperature, wherein the second temperature is as least as high as the first temperature. In still an even more particular embodiment, performing the action includes annealing the doped semiconductor layer at a temperature of at least approximately 650° C. In another even more particular embodiment, performing the action includes forming a layer over the doped semiconductor layer.

In a second aspect, a process of forming an electronic device can includes epitaxially growing a doped semiconductor layer from a substrate, wherein the doped semiconductor layer is substantially monocrystalline and includes a dopant. The process can also include disrupting a crystal pattern of the doped semiconductor layer adjacent to an exposed surface of the doped semiconductor layer. The process can still also include performing an action to reduce a dopant content at an exposed surface of a workpiece that includes the substrate and the doped semiconductor layer, wherein performing the action is performed after disrupting the crystal pattern of the doped semiconductor layer and before the doped semiconductor layer is exposed to a room ambient.

In one embodiment of the second aspect, performing the action includes annealing the doped semiconductor layer. In a particular embodiment, annealing the doped semiconductor layer is performed using a gas including $H_2$, a halogen-containing gas, or any combination thereof. In another embodiment, performing the action includes forming another layer over the doped semiconductor layer. In still another embodiment, performing the action includes exposing the doped semiconductor layer to a plasma, radiation having an emission maximum at a wavelength no greater than approximately 400 nm, an energy beam, or any combination thereof.

In a third aspect, a process of forming an electronic device can include forming an in-situ doped semiconductor layer over a substrate. Forming the in-situ doped semiconductor layer includes reacting a dopant-containing gas and a semiconductor-containing gas at a reaction temperature, and as formed, a dopant concentration within the in-situ doped semiconductor layer is higher than a solid solubility of the in-situ doped semiconductor layer at the reaction temperature. The process also includes performing an action to reduce a dopant content at an exposed surface of a workpiece that includes the substrate and the in-situ doped semiconductor layer, wherein performing the action is performed after forming the in-situ doped semiconductor layer and before the in-situ doped semiconductor layer is exposed to a room ambient.

In one embodiment of the third aspect, the process further includes introducing a first gas, a second gas, and a third gas into a chamber, wherein the first gas includes $Si_aH_{(2a+2)}$, wherein a is 1, 2, or 3; the second gas includes $Si_bC_cH_{(2(b+c)+2)}$, wherein a sum of b+c is 1, 2, or 3, and c is greater than 0; and the third gas includes $PH_3X_{3-d}$, wherein X is a halogen, and d is 0, 1, 2, or 3. In a particular embodiment, the first gas is $SiH_4$, the second gas is $SiH_3CH_3$, and the third gas is $PH_3$. In another particular embodiment, the process further includes forming a gate electrode over the substrate, and etching a portion of the substrate to form a trench adjacent to the gate electrode, wherein forming an in-situ doped semiconductor layer is performed after forming the trench. The in-situ doped semiconductor layer includes forming a semiconductor layer including silicon, carbon, and phosphorus. In a more particular embodiment, performing the action includes annealing the in-situ doped semiconductor layer at a temperature of at least approximately 650° C.

In another embodiment of the third aspect, performing the action includes forming another layer over the in-situ doped semiconductor layer. In still another embodiment, as formed, the dopant concentration within the in-situ doped semiconductor layer is at least $1E21$ atoms/$cm^3$.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

Many other embodiments may be apparent to those of skill in the art upon reviewing the disclosure. Other embodiments may be used or derived from the disclosure, such that a structural substitution, logical substitution, or another change may be made without departing from the scope of the disclosure. Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
   forming a doped semiconductor layer over a substrate, wherein the doped semiconductor layer includes a dopant and at least two other different elements selected from a group consisting of C, Si, and Ge; and performing an action to reduce a dopant content at an exposed surface of a workpiece that includes the substrate and the doped semiconductor layer, wherein:
performing the action includes exposing the doped semiconductor layer to a plasma, radiation having an emission maximum at a wavelength no greater than approximately 400 nm, an energy beam, or any combination thereof; and
performing the action is performed after forming the doped semiconductor layer and before the doped semiconductor layer is exposed to a room ambient.

2. The process of claim 1, wherein forming a doped semiconductor layer comprises forming a doped semiconductor layer including carbon.

3. The process of claim 1, wherein forming a doped semiconductor layer comprises forming an in-situ, phosphorus doped semiconductor layer.

4. The process of claim 1, further comprising etching a semiconductor material within a substrate to form a trench within the substrate, wherein forming the doped semiconductor layer comprises forming the doped semiconductor layer within the trench.

5. The process of claim 1, wherein performing the action further comprises forming a layer over the doped semiconductor layer.

6. The process of claim 4, further comprising forming a gate structure over the substrate before etching the semiconductor material.

7. The process of claim 6, wherein:
forming the doped semiconductor layer comprises forming an in-situ phosphorus doped semiconductor layer at a first temperature; and
performing the action is performed at a second temperature, wherein the second temperature is as least as high as the first temperature.

8. The process of claim 7, wherein performing the action further comprises annealing the doped semiconductor layer at a temperature of at least approximately 650° C.

9. A process of forming an electronic device comprising:
epitaxially growing a doped semiconductor layer from a substrate, wherein the doped semiconductor layer is substantially monocrystalline and includes a dopant;
disrupting a crystal pattern of the doped semiconductor layer adjacent to an exposed surface of the doped semiconductor layer; and
performing an action to reduce a dopant content at an exposed surface of a workpiece that includes the substrate and the doped semiconductor layer, wherein:
performing the action includes exposing the doped semiconductor layer to a plasma, radiation having an emission maximum at a wavelength no greater than approximately 400 nm, an energy beam, or any combination thereof; and
performing the action is performed after disrupting the crystal pattern of the doped semiconductor layer and before the doped semiconductor layer is exposed to a room ambient.

10. The process of claim 9, wherein performing the action further comprises annealing the doped semiconductor layer.

11. The process of claim 10, wherein annealing the doped semiconductor layer is performed using a gas including $H_2$, a halogen-containing gas, or any combination thereof.

12. The process of claim 9, wherein performing the action further comprises forming another layer over the doped semiconductor layer.

13. A process of forming an electronic device comprising:
forming an in-situ doped semiconductor layer over a substrate, wherein:
forming the in-situ doped semiconductor layer comprises reacting a dopant-containing gas and a semiconductor-containing gas at a reaction temperature; and
as formed, a dopant concentration within the in-situ doped semiconductor layer is higher than a solid solubility of the in-situ doped semiconductor layer at the reaction temperature; and
performing an action to reduce a dopant content at an exposed surface of a workpiece that includes the substrate and the in-situ doped semiconductor layer, wherein performing the action is performed after forming the in-situ doped semiconductor layer and before the in-situ doped semiconductor layer is exposed to a room ambient.

14. The process of claim 13, further comprising introducing a first gas, a second gas, and a third gas into a chamber, wherein:
the first gas comprises $Si_aH_{(2a+2)}$, wherein a is 1, 2, or 3;
the second gas comprises $Si_bC_cH_{(2(b+c)+2)}$, wherein a sum of b+c is 1, 2, or 3, and c is greater than 0; and
the third gas comprises $PH_3X_{3-d}$, wherein X is a halogen, and d is 0, 1, 2, or 3.

15. The process of claim 13, wherein performing the action comprises annealing the in-situ doped semiconductor layer at a temperature of at least approximately 650° C.

16. The process of claim 13, wherein performing the action comprises forming another layer over the in-situ doped semiconductor layer.

17. The process of claim 13, wherein as formed, the dopant concentration within the in-situ doped semiconductor layer is at least 1E21 atoms/cm$^3$.

18. The process of claim 14, wherein the first gas is $SiH_4$, the second gas is $SiH_3CH_3$, and the third gas is $PH_3$.

19. The process of claim 14, wherein:
the process further comprises:
forming a gate electrode over the substrate; and
etching a portion of the substrate to form a trench adjacent to the gate electrode, wherein etching the portion of the substrate is performed before forming the in-situ doped semiconductor layer; and
forming the in-situ doped semiconductor layer comprises forming a semiconductor layer including silicon, carbon, and phosphorus.

* * * * *